United States Patent [19]

Walsh

[11] 4,315,211
[45] Feb. 9, 1982

[54] PREAMPLIFIER FOR VOLTAGE MEASURING INSTRUMENT WITH NON-INTERACTING ZERO AND SPAN CONTROLS

[75] Inventor: Thomas J. Walsh, Hatboro, Pa.

[73] Assignee: Leeds & Northrup Company, North Wales, Pa.

[21] Appl. No.: 126,752

[22] Filed: Mar. 3, 1980

[51] Int. Cl.³ .................. G01R 1/30; G01R 15/08
[52] U.S. Cl. .......................... 324/123 R; 324/115; 324/131
[58] Field of Search ............. 324/123 R, 115, 131, 324/99 R, 100; 346/32; 318/677, 678, 681

[56] References Cited

U.S. PATENT DOCUMENTS

| | | | |
|---|---|---|---|
| 3,281,685 | 10/1966 | Talbot, Jr. | 324/99 R |
| 3,317,833 | 5/1967 | Miller | 324/99 R |
| 3,401,393 | 9/1968 | Cirimele et al. | 346/32 |
| 3,697,871 | 10/1972 | MacMullan | 324/99 R |
| 4,213,088 | 7/1980 | Nossen | 324/115 |

*Primary Examiner*—Ernest F. Karlsen
*Attorney, Agent, or Firm*—William G. Miller, Jr.; Raymond F. MacKay

[57] ABSTRACT

A preamplifier circuit for a voltage measuring instrument which provides for noninteracting span and zero adjustments. Two voltage follower circuits are used. The first produces a current through the output resistor of the preamplifier proportional to the voltage being measured while the second produces a current through the output resistor proportional to a fixed reference voltage. For both amplifiers, the proportionality is adjustable by a potentiometer which modifies the feedback on the first amplifier and the part of the reference used as input to the second amplifier.

6 Claims, 2 Drawing Figures

4,315,211

PREAMPLIFIER FOR VOLTAGE MEASURING INSTRUMENT WITH NON-INTERACTING ZERO AND SPAN CONTROLS

BACKGROUND OF THE INVENTION

This invention relates to measuring instruments such as industrial recorders which measure the voltage generated by primary elements in response to a physical quantity. More particularly, this invention relates to an improvement in the preamplifier section of such an instrument and specifically to those adjustments in the preamplifier section dedicated to the adjustment of the span and zero of the instrument for calibration purposes.

For the purposes of this description, the span of an instrument such as a voltage recorder will be considered as that range of values for the measured variable covered by a full scale travel of the instrument printer.

The zero of an instrument shall be considered as that point on the scale or fictitious point corresponding to a value for the measured variable of zero volts.

The prior art devices have usually utilized means for making the span and zero adjustments which were incorporated in the preamplifier circuit in such a way that they produced an interaction, one upon the other. Thus, with the prior art instruments, whenever it was necessary to calibrate the instrument by adjusting either the span adjustment or the zero adjustment, it was also necessary to adjust the other one and then refine the original adjustment, thus carrying out the interaction necessary in order to take care of the interacting nature of those adjustments.

SUMMARY OF THE INVENTION

In carrying out this invention there is provided a first amplifier circuit means which has its input connected to a source of potential to be measured. This first amplifying circuit is operable to produce at its output a voltage which has a proportional relationship to the voltage of the input with that relationship being adjustable to determine the span of the measuring circuit.

A second amplifying circuit means is provided which has its input connected to a reference potential. This amplifying circuit is operable to produce an output voltage having a predetermined proportional relationship to the reference voltage with that relationship being adjustable so as to vary the effective zero of the measuring circuit.

In addition to the above elements, there is provided a summing network which includes a separate impedance in series with the output of each of the amplifying circuits and another impedance connected to these series impedances so that the other impedance carries the current from both amplifying circuits to provide a potential across the third impedance which is used as an output from the preamplifier.

BRIEF DESCRIPTION OF THE DRAWINGS

In the drawings, in which like reference numerals refer to like elements.

DESCRIPTION OF THE PREFERRED EMBODIMENT

Figure 1:
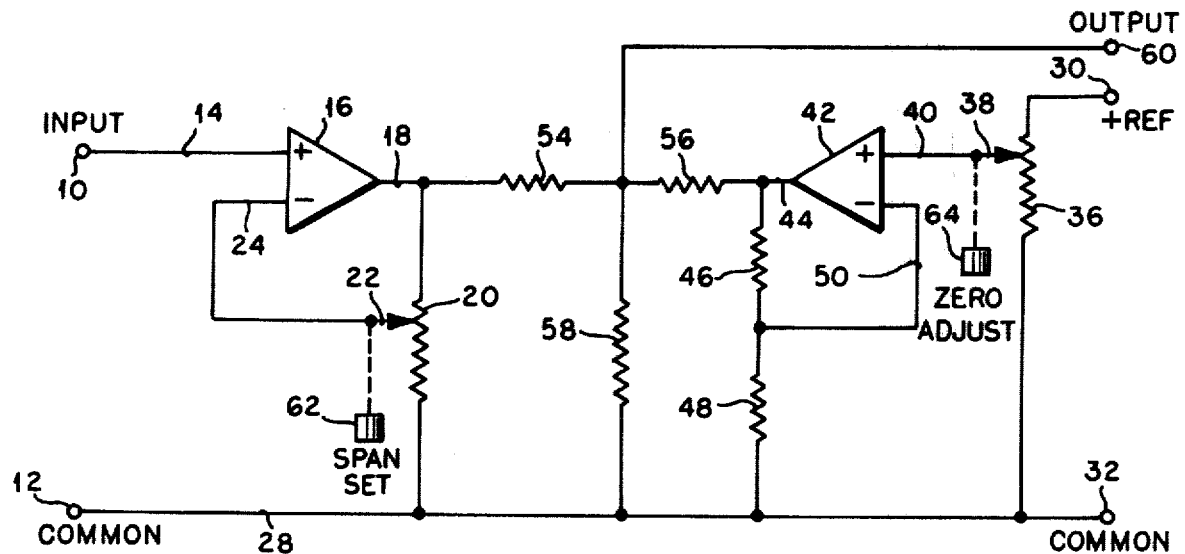
FIG. 1 is a circuit diagram of one form of the invention.

In FIG. 1 there is shown a circuit diagram for a preamplifier of a voltage measuring instrument in which the input to the preamplifier which may, for example, come from a primary element for measuring a physical quantity, is introduced across the input terminals, namely between the input terminal 10 and the common terminal 12. The voltage which the primary element produces at the terminal 10 is introduced by line 14 to a first amplifying circuit means shown as differential amplifier 16. As shown in FIG. 1 the input on line 14 connects to the non-inverting input of the amplifier 16.

The output of amplifier 16 on line 18 is utilized to provide a feedback by way of potentiometer 20, shown as having an adjustable tap 22, to the inverting input of amplifier 16 over the input line 24. Thus, it will be evident that the output voltage from amplifier 16 appears across the potentiometer 20 which is connected between the output line 18 and the common line 28. By virtue of the connections described, the output voltage between output line 18 and the common line 28 follows the input voltage between terminals 10 and 12 in a proportion determined by the setting of potentiometer tap 22. Thus, the circuit which includes amplifier 16 and potentiometer 20 may be identified as a voltage follower circuit since its voltage output is directly proportional to voltage input.

The preamplifier circuit of FIG. 1 also utilizes a second amplifying circuit means which forms a voltage follower circuit. That circuit is connected to an input from a positive reference potential between terminal 30 and the common terminal 32. The fixed voltage drop between terminal 30 and terminal 32 appears across the potentiometer 36 so that a portion of that potential drop may be tapped off by the adjustable tap 38 which is connected by way of input line 40 to the non-inverting input of the differential amplifier 42.

The output of differential amplifier 42 which appears on output line 44 is then connected to the inverting input to amplifier 42 by way of a gain determining network which is comprised of the series-connected resistors 46 and 48 which are connected between output line 44 and the common line 28. The input to the inverting terminal of amplifier 42 is then by way of line 50 from the junction between resistors 46 and 48.

As a result of the circuit connections for the second voltage follower circuit which includes potentiometer 36, amplifier 42, and gain determining resistors 46 and 48, there is produced between output line 44 and a common line 28, a fixed potential which is directly proportional to the reference potential introduced between terminals 30 and 32 with the proportionality determined by the position of the adjustable tap 38 on potentiometer 36.

Each of the voltage follower circuits above described is connected to a summing network which consists of the resistors 54, 56, and 58. The resistors 54 and 56 are respectively connected in series with the output lines 18 and 44 of the first and second differential amplifiers, and the junction between resistors 54 and 56 is then connected by way of the output resistor 58 to the common line 28 so that the currents produced in resistor 58 are the sum of the currents from the first and second voltage follower circuits through the resistors 54 and 56 so as to produce between the output terminal 60 and the common terminal 32 an output corresponding to the potential across resistor 58. That output can be utilized as an input to an amplifier section of the voltage measuring instrument.

With the arrangement of FIG. 1 when it is desired to adjust the span of the voltage measuring instrument to which the circuit of FIG. 1 is connected, an adjustment of the tap 22 by adjusting knob 62 will effectively change that part of the current through output resistor 58 provided from amplifier 16 so that it has a different proportion to the input potential being measured and thus is effective to change the range of the variable being measured which would be covered by a full scale deflection of the measuring instrument.

Similarly, when it is desired to adjust the zero of the voltage measuring instrument for which the circuit of FIG. 1 is a preamplifier section, the knob 64 may be adjusted to change the position of variable tap 38 of potentiometer 36 so that the output of amplifier 42 has a different proportion of the reference potential introduced between terminals 30 and 32 thus producing a current through resistor 58 due to amplifier 42 which is of a different value to thereby establish a change in potential across resistor 58 so that the zero of the instrument has been adjusted to effectively change the point on the instrument scale to which a zero input to amplifier 16 would correspond.

It will be evident from an examination of FIG. 1 and from the description above of each operation that an adjustment of the span of the instrument as by adjusting the knob 62 will not affect the current through resistor 58 resulting from the setting of knob 64 which establishes the zero for the instrument and similarly any adjustment of the knob 64 will not change the current through resistor 58 so as to not affect the result of the positioning of the span setting knob 62. There is thus provided both span and zero adjustments in the preamplifier of FIG. 1 which are not interacting, thus allowing the calibration of the instrument with a minimum of difficulty.

Figure 2:
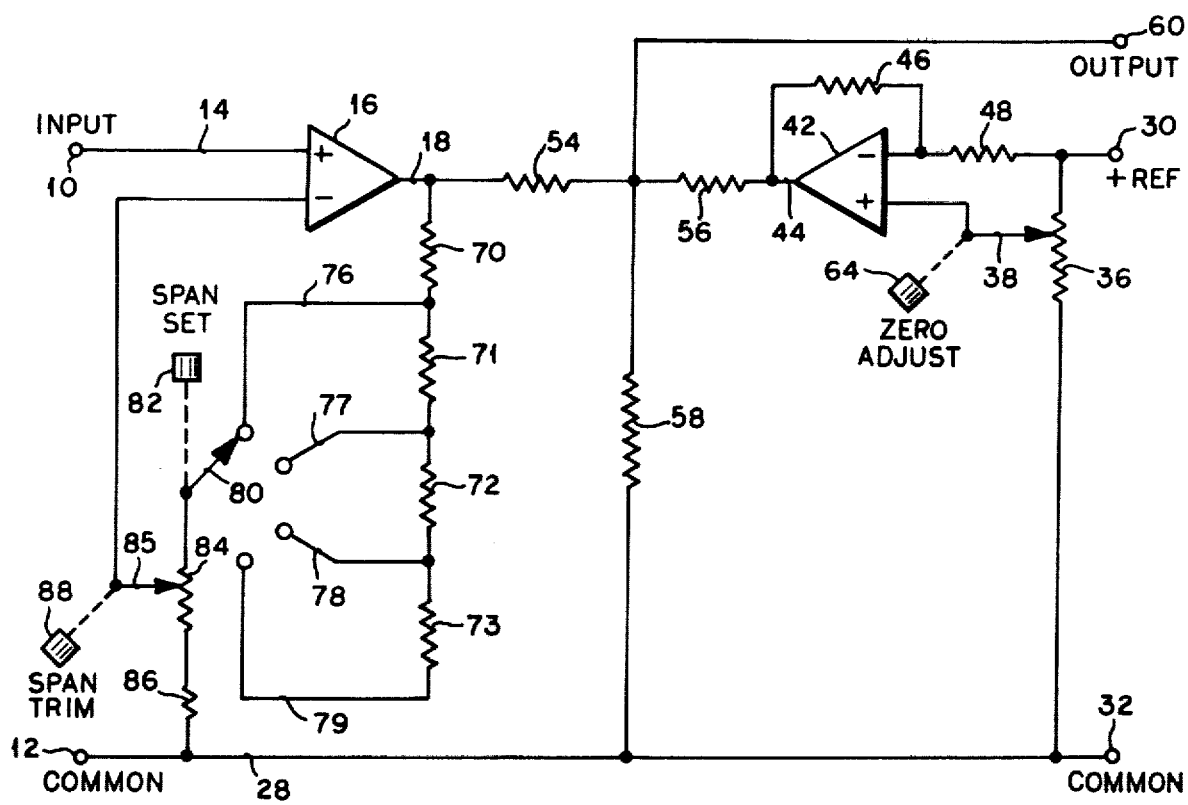
FIG. 2 is an alternate form for a circuit to carry out the invention.

In FIG. 2 there is shown a modification of the circuit of FIG. 1 which makes possible an adjustment of the zero so that it can have either a positive or a negative value and which provides a slightly different circuit for setting the span of the instrument.

In FIG. 2 the feedback of the differential amplifier 16 to the inverting input is provided by a more complicated circuit than that of FIG. 1. The potentiometer 20 with its tap 22 in FIG. 1 are replaced in FIG. 2 by a series of resistors 70-73 which have the junctions between them connected by way of lines 76-79 to corresponding taps of an adjustable selective switch having its selector 80 positioned by a span setting knob 82 so that any of four predetermined spans can be selected depending upon the values of the resistors 70-73. The selector 80 is then connected by way of potentiometer 84 and a series connected resistor 86 to the common line 28 so that by way of the tap 85 of potentiometer 84 as it may be adjusted by the knob 88, there may be tapped off the feedback signal for the inverting input of amplifier 16. Thus, the arrangement of FIG. 2 provides a coarse and fine adjustment to the span as compared with the single adjustment of FIG. 1.

In the circuit of the second voltage follower which includes differential amplifier 42, the gain determining resistors 46 and 48 are connected between the output line 44 and the reference input voltage introduced at terminal 30. Thus, the gain determining resistors 46 and 48 may be considered to have been connected in FIG. 1 to a reference potential of zero, namely that appearing on the common line 28, whereas in FIG. 2 these gain determining resistors are connected to a positive reference potential at terminal 30.

The non-inverting input to amplifier 42 in FIG. 2 is obtained in a similar manner to that shown in FIG. 1 in that it is derived from tap 38 of potentiometer 36 which is connected between the reference input terminal 30 and the common terminal 32. By virtue of the connection of the gain determining resistors to a positive reference potential at terminal 30, it is possible by the adjustment of the tap 38 to make the zero adjustment provided by the preamplifier circuit of FIG. 2 so that it provides either a positive or a negative zero for the instrument by introducing a current through resistor 48 which is in either one direction or the other, depending upon the position of the tap 38.

The circuit of FIG. 2 provides the same non-interacting characteristic between the span and zero adjustments as provided by FIG. 1 since the circuit configuration is generally similar having only the differences noted above.

As an example of the resistor values which may be used in constructing a circuit such as shown in FIG. 2, the following is a list of one set of values which have been found to be useful in order to provide a span adjustment of 1 to 5 volts and a zero adjustment of −25% to +125%:

| RESISTOR | OHMS |
| --- | --- |
| 36 | 10K |
| 46 | 5K |
| 48 | 10K |
| 54 | 19K |
| 56 | 10K |
| 58 | 5K |
| 70 | 10K |
| 71 | 6K |
| 72 | 10K |
| 73 | 20K |
| 84 | 10K |
| 86 | 5K |

The differential amplifiers 16 and 42 may be 741 operational amplifiers and the reference potential may be +6.2 volts. With these parameters the output will go from 0 to 1.5 volts for full scale deflection. That range at the output terminal will correspond to a range of input voltages of 1 to 5 volts.

What is claimed is:

1. A preamplifier for a voltage measuring circuit with a span and zero adjusting circuit, comprising:

a first amplifying circuit means having its input connected to a source of potential to be measured, said circuit being operable to produce at its output a voltage which has a proportional relationship to the voltage of said input with the relationship being continuously adjustable to determine the span of the measuring circuit;

a second amplifying circuit means having its input connected to a reference potential, said circuit being operable to produce at its output a voltage having a predetermined proportional relationship to said reference voltage, said predetermined relationship being adjustable to vary the effective zero of the measuring circuit; and a summing network including a separate impedance in series with the output of each of said amplifying circuits and another impedance connected to said series impedances, so that said other impedance carries the current output from both amplifying circuits to produce a potential across said other impedance as an output from said preamplifier which is proportional to the sum of the voltage outputs of said amplifying circuits.

2. A preamplifier for a voltage measuring circuit with a span and zero adjusting circuit, comprising:
- a first voltage follower circuit having a differential amplifier whose noninverting input is connected to the voltage to be measured with the inverting input connected to the tap of a continuously adjustable potentiometer across the output of said amplifier;
- a source providing a fixed potential;
- a second voltage follower circuit having a differential amplifier with its inverting input connected to a gain determining network and with its noninverting input connected to the tap of a potentiometer across said fixed potential; and
- a summing network including first and second output resistors respectively connected in series with the outputs of said first and second amplifiers and having a junction therebetween connected to a third output resistor and to the output of said preamplifier so that said third resistor carries the total output current from the first and second amplifiers.

3. A preamplifier as set forth in claim 2 in which said gain determining network is two series-connected resistors.

4. In a voltage measuring instrument for measuring the voltage drop between an input terminal and a common terminal, a preamplifier having span and zero controls comprising:
- a first voltage follower circuit for producing a first voltage having a value directly proportional to said voltage drop to be measured, said circuits including,
  - a first differential amplifier having its non-inverting input connected to said input terminal,
  - a first potentiometer connected across the output of said first amplifier with a continuously adjustable tap connected to the inverting input of said first amplifier to provide adjustment of the span, and
  - an output resistor in series with the output of said first amplifier;
- a second voltage follower circuit for producing a second voltage having an adjustable constant value including,
  - a second differential amplifier,
  - an output resistor in series with the output of said second amplifier,
  - a gain determining circuit having two series connected resistors, said circuit being connected from the junction between the second amplifier output and the output resistor to a fixed potential point with the junction between the two series resistors being connected to the inverting input of the second amplifier.
  - a second potentiometer connected between a fixed potential terminal and said common terminal with its adjustable tap connected to the non-inverting input of said second amplifier to provide for change in the zero of the instrument, and
- an output resistor for said preamplifier connected at one terminal to the junction between the output resistors from said first and second amplifiers and with the other terminal to said common terminal so that said preamplifier output resistor carries a current which is the sum of the currents carried by the output resistors associated with said first and second amplifiers so that there is produced across said preamplifier output resistor a potential which is the measure of the potential drop between the input terminal and the common terminal whose value provides adjustment for span and zero.

5. A preamplifier as set forth in claim 3 in which the fixed potential to which the gain determining circuit is connected is the same as that to which the first potentiometer is connected.

6. A preamplifier as set forth in claim 3 in which the fixed potential for the gain determining circuit and the second potentiometer are of the same values corresponding to a fixed positive potential.

* * * * *